(12) United States Patent
Paillet et al.

(10) Patent No.: US 8,629,667 B2
(45) Date of Patent: Jan. 14, 2014

(54) PULSE WIDTH MODULATOR WITH AN ADJUSTABLE WAVEFORM GENERATOR FOR CONTROLLING DUTY CYCLE OF A PULSE WIDTH MODULATED SIGNAL

(75) Inventors: Fabrice Paillet, Hillsboro, OR (US); Peter Hazucha, Beaverton, OR (US); Gerhard Schrom, Hillsboro, OR (US); Tanay Karnik, Portland, OR (US); Sung T. Moon, Hillsboro, OR (US); Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 13/405,175

(22) Filed: Feb. 24, 2012

(65) Prior Publication Data

US 2012/0194245 A1 Aug. 2, 2012

Related U.S. Application Data

(63) Continuation of application No. 11/613,098, filed on Dec. 19, 2006, now abandoned.

(51) Int. Cl.
*G05F 1/575* (2006.01)
*H03K 4/06* (2006.01)

(52) U.S. Cl.
USPC ............ 323/282; 323/288; 327/140; 327/175

(58) Field of Classification Search
USPC .......... 323/272, 282, 288; 327/131, 140, 175; 363/21.11, 21.18, 41
See application file for complete search history.

(56) References Cited

U.S. PATENT DOCUMENTS

| | | | |
|---|---|---|---|
| 3,420,993 A | | 1/1969 | Chamberlain et al. |
| 4,079,294 A | | 3/1978 | Teuling |
| 4,177,428 A | | 12/1979 | Klank |
| 4,641,246 A | | 2/1987 | Halbert et al. |
| 4,825,347 A | * | 4/1989 | Guerrera et al. ................. 363/41 |
| 4,926,442 A | | 5/1990 | Bukowski et al. |
| 5,394,020 A | * | 2/1995 | Nienaber ....................... 327/140 |
| 5,453,704 A | | 9/1995 | Kawashima |
| 5,502,419 A | * | 3/1996 | Kawasaki et al. ............. 332/109 |
| 5,691,628 A | | 11/1997 | Martin |

(Continued)

FOREIGN PATENT DOCUMENTS

| | | |
|---|---|---|
| CN | 1848683 | 10/2006 |
| JP | 05166397 | 7/1993 |

(Continued)

OTHER PUBLICATIONS

LM471 Operational Amplifier datasheet, National Semiconductor. Aug. 2000.*

(Continued)

*Primary Examiner* — Adolf Berhane
*Assistant Examiner* — Fred E Finch, III
(74) *Attorney, Agent, or Firm* — Blakely, Sokoloff, Taylor & Zafman LLP

(57) ABSTRACT

Disclosed herein are pulse width modulator (PWM) solutions with comparators not relying on a variable reference to adjust duty cycle. In accordance with some embodiments, a pulse width modulator having a comparator with an applied adjustable waveform to generate a bit stream with a controllably adjustable duty cycle is provided.

22 Claims, 9 Drawing Sheets

(56) References Cited

U.S. PATENT DOCUMENTS

| | | | |
|---|---|---|---|
| 5,896,284 A | | 4/1999 | Murasato et al. |
| 5,929,671 A | * | 7/1999 | Best ............................. 327/132 |
| 5,949,265 A | * | 9/1999 | Bracchitta et al. ............ 327/206 |
| 6,075,352 A | | 6/2000 | Kates et al. |
| 6,384,652 B1 | | 5/2002 | Shu |
| 6,552,919 B1 | * | 4/2003 | Bors ............................. 363/42 |
| 6,559,492 B1 | | 5/2003 | Hazucha et al. |
| 6,593,725 B1 | * | 7/2003 | Gallagher et al. ............ 323/284 |
| 6,628,106 B1 | | 9/2003 | Batarseh |
| 6,653,891 B1 | | 11/2003 | Hazucha |
| 6,683,445 B2 | | 1/2004 | Park |
| 6,711,395 B1 | | 3/2004 | Tonegawa et al. |
| 6,801,026 B2 | | 10/2004 | Schrom et al. |
| 6,838,863 B2 | | 1/2005 | Hazucha et al. |
| 6,940,189 B2 | | 9/2005 | Gizara |
| 7,161,815 B2 | | 1/2007 | Mori |
| 7,202,648 B2 | | 4/2007 | Gardner |
| 7,247,930 B2 | | 7/2007 | Narendra et al. |
| 7,274,181 B2 | | 9/2007 | Schrom et al. |
| 7,315,463 B2 | | 1/2008 | Schrom et al. |
| 7,456,667 B2 | | 11/2008 | Taylor et al. |
| 7,486,122 B1 | | 2/2009 | Hwang |
| 7,518,836 B2 | * | 4/2009 | Kim et al. ...................... 361/18 |
| 7,583,113 B2 | | 9/2009 | Celani |
| 7,671,642 B2 | | 3/2010 | Payrard |
| 2004/0008011 A1 | * | 1/2004 | Wang et al. .................... 323/213 |
| 2004/0227549 A1 | * | 11/2004 | Solie ............................. 327/131 |
| 2005/0104570 A1 | | 5/2005 | Lee et al. |
| 2005/0179489 A1 | * | 8/2005 | Zepp ............................. 330/251 |
| 2005/0200389 A1 | * | 9/2005 | Day et al. ...................... 327/131 |
| 2006/0233232 A1 | | 10/2006 | He et al. |
| 2006/0238182 A1 | | 10/2006 | Yoshino |
| 2006/0284682 A1 | * | 12/2006 | Lee et al. ...................... 330/291 |

FOREIGN PATENT DOCUMENTS

| | | |
|---|---|---|
| JP | 05347518 | 12/1993 |
| JP | 06076571 | 3/1994 |
| JP | 08083487 | 3/1996 |
| JP | 09074338 | 3/1997 |
| JP | 200576363 | 6/2005 |

OTHER PUBLICATIONS

First Office Action mailed Jul. 10, 2009 for Chinese Application No. 2007 10300200.9.
Second Office Action mailed Nov. 9, 2011 for Chinese Application No. 2007 10300200.9.
Non-Final Office Action mailed Jul. 29, 2009 for U.S. Appl. No. 11/613,098.
Non-Final Office Action mailed Feb. 16, 2010for U.S. Appl. No. 11/613,098.
Final Office Action mailed Sep. 14, 2010 for U.S. Appl. No. 11/613,098.
Non-Final Office Action mailed Mar. 31, 2011 for U.S. Appl. No. 11/613,098.
Non-Final Office Action mailed Nov. 24, 2009 for U.S. Appl. No. 11/553,184.
Final Office Action mailed Jun. 23, 2010 for U.S. Appl. No. 11/553,184.
Non-Final Office Action mailed Mar. 30, 2011for U.S. Appl. No. 11/553,184.
Office Action mailed Jan. 18, 2011 for Japanese Patent Application No. 2007-276991.
Notice of Grant mailed Apr. 12, 2011 for Japanese Patent Application No. 2007-276991; no translation available.
Notification of Grant mailed Jul. 5, 2012 for Chinese Patent Application No. 2007 10300200.9.

* cited by examiner

PULSE WIDTH MODULATOR WITH AN ADJUSTABLE WAVEFORM GENERATOR FOR CONTROLLING DUTY CYCLE OF A PULSE WIDTH MODULATED SIGNAL

CLAIM OF PRIORITY

The present patent application is a Continuation of, and claims priority to and incorporates by reference in its entirety, the corresponding U.S. patent application Ser. No. 11/613,098, entitled, "Pulse Width Modulator" filed on Dec. 19, 2006 now abandonded.

RELATED APPLICATIONS

The present patent application is related to commonly owned U.S. patent application Ser. No. 11/641,006 titled, "Signal Generation Circuit," filed on Dec. 19, 2006 and issued as U.S. Pat. No. 7,602,256 on Oct. 13, 2009, which is incorporated herein by reference in its entirety.

TECHNICAL FIELD

The embodiments of the present invention relate generally to signal generator circuits and in particular, to pulse width modulator circuits.

BACKGROUND

Switching type voltage regulators and other devices use pulse width modulators (PWMs) to generate pulse train (bit stream) signals with a controllably variable duty cycle. Duty cycle is the ratio of the duration during which the stream is a binary assertion (e.g., high level) compared to the duration during which the stream is a binary de-assertion (e.g., low level) over a period of the signal. For example, in a system where a high ('1) is an assertion, a 60% duty cycle implies that the high state last 60% of the period, while the low state last only 40%.

With switching voltage regulators, a PWM is typically used to turn switches on and off in order to increase or decrease the amount of energy supplied to a regulated voltage in order to control the voltage. The switches are typically on when the bit stream is asserted and off when it is not asserted. Thus, more or less energy can be supplied to the load by increasing or decreasing, respectively, the bit stream duty cycle.

With reference to FIG. 1, a portion of a conventional PWM is shown. It comprises a triangular waveform synthesizer (or generator) 101 coupled to the negative input of a comparator 103. A variable voltage reference, controls the pulse duty cycle generated by the PWM and is coupled to the other (positive) input. The triangular waveform generator generates a waveform between two fixed voltages, for example, ground and VCC. The comparator compares the signal from the triangle wave generator against the level of the variable reference. The comparator generates at its output a bit stream having a pulse width that depends on the value of the variable voltage reference. With a higher reference, more of each triangle wave causes the output to be low resulting in a bit stream with a lower duty cycle (assuming that the bit stream asserts when high). In contrast, when the variable reference is lower, more of each triangle wave causes the output to be high, resulting in a higher duty cycle. For example, when the reference is at the low rail of the triangle wave, the duty cycle is 100%, and when it is at its high rail, the duty cycle is 0%. Thus, the duty cycle can be controlled to be anywhere between 100 and 0 percent by correspondingly varying the reference between Gnd and VCC.

Unfortunately, the comparator circuit and circuit used to create the variable reference can be relatively complex, especially if it is to perform with reasonable precision. With multiphase switching regulators, which typically use a separate PWM for each phase, this becomes even more problematic. In addition, distributing the variable reference signal into the multiple comparators can result in inconsistent reference levels and in noise. Accordingly, an improved solution is desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Disclosed herein are PWM solutions with comparators not relying on a variable reference to adjust duty cycle. In accordance with some embodiments, a waveform (such as a triangle, sawtooth, or sinusoidal wave) is applied to a comparator with a fixed reference to generate a bit stream with a controllable duty cycle. In some embodiments, the offset level of the applied waveform can be varied to adjust the duty cycle. However, before describing such PWMs, a dual rail generator that may be used to create an adjustable waveform will be discussed.

Dual Rail Generator

Figure 1:
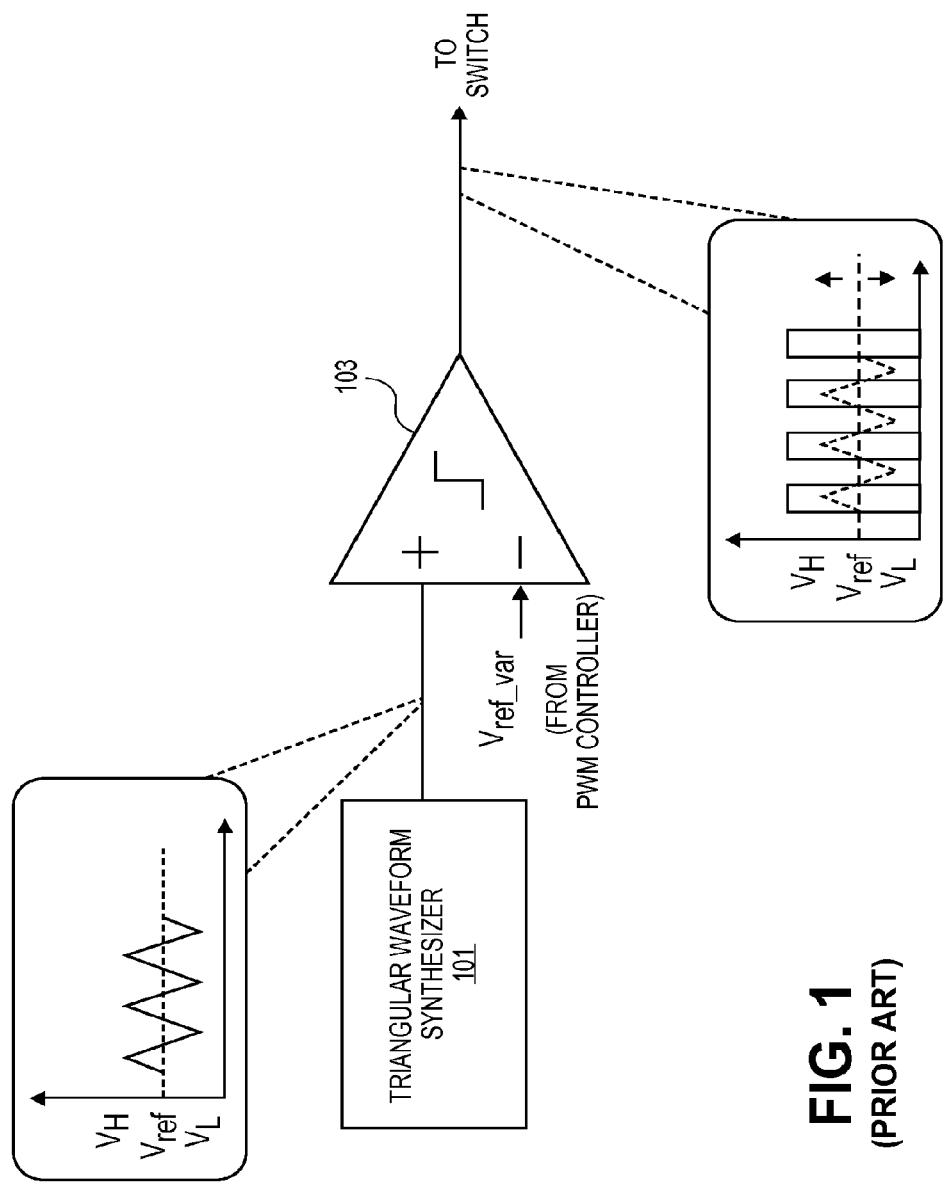
FIG. 1 shows a portion of a conventional pulse width modulator using a variable reference comparator.
Figure 2A:
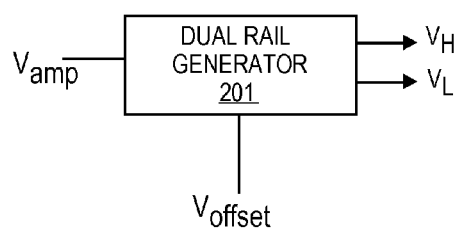
FIG. 2A is a block diagram of a dual rail generator in accordance with some embodiments.
Figure 2B:
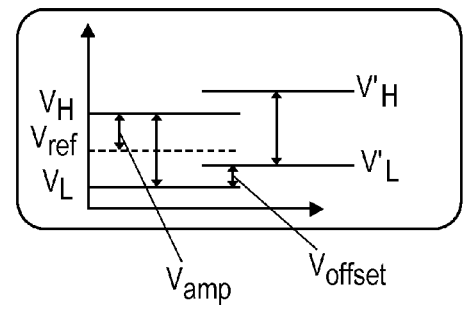
FIG. 2B is a graph illustrating a dual rail signal in accordance with some embodiments.

FIGS. 2A and 2B generally show a dual rail generator providing first and second (High and Low) voltage rail outputs, $V_H$ and $V_L$, based on applied amplitude ($V_{amp}$) and offset ($V_{offset}$) inputs, relative to a reference voltage ($V_{ref}$). (In the depicted embodiment, the reference voltage is fixed and set within the dual rail generator and thus is not shown in FIG. 1A. However, in some embodiments, an externally applied and/or variable reference could be used. Moreover, the reference voltage could have a value of 0 in some embodiments). Mathematically, $V_H=V_{ref}+V_{amp}+V_{offset}$ and $V_L=V_{ref}-V_{amp}+V_{offset}$. As graphically illustrated in FIG. 2B, this results in the difference between the High and Low rails being two times (twice) the applied amplitude. They are symmetrical about the reference voltage ($V_{ref}$) when there is no offset ($V_{offset}$ equals 0), but if an offset is applied, the High and Low rails are equally shifted, either upward or downward in accordance with the offset value. Thus, by appropriately adjusting the $V_{offset}$ and $V_{amp}$ signals, numerous different $V_H$-$V_L$ combinations may be attained.

Figure 2C:
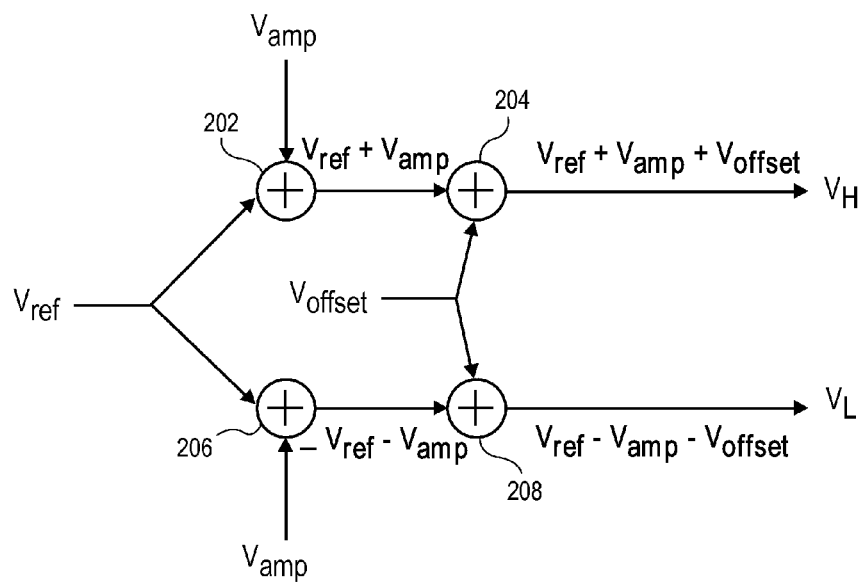
FIG. 2C is a signal flow diagram of a dual rail generator in accordance with some embodiments.

FIG. 2C shows a signal flow representation of the dual rail generator of FIG. 2A in accordance with some embodiments. It comprises adders 202, 204, 206, and 208 to generate the High and Low rails ($V_H$, $V_L$) in accordance with the equations set forth above. The reference voltage $V_{ref}$ is applied to adders 202, 204 and respectively added to $V_{amp}$ and $-V_{amp}$ thereby generating $V_{ref}+V_{amp}$ and $V_{ref}-V_{amp}$ at their outputs. In turn, these outputs are respectively added to the offset ($V_{offset}$) at adders 204 and 208 to generate $V_H$ and $V_L$, as indicated.

Figure 3:
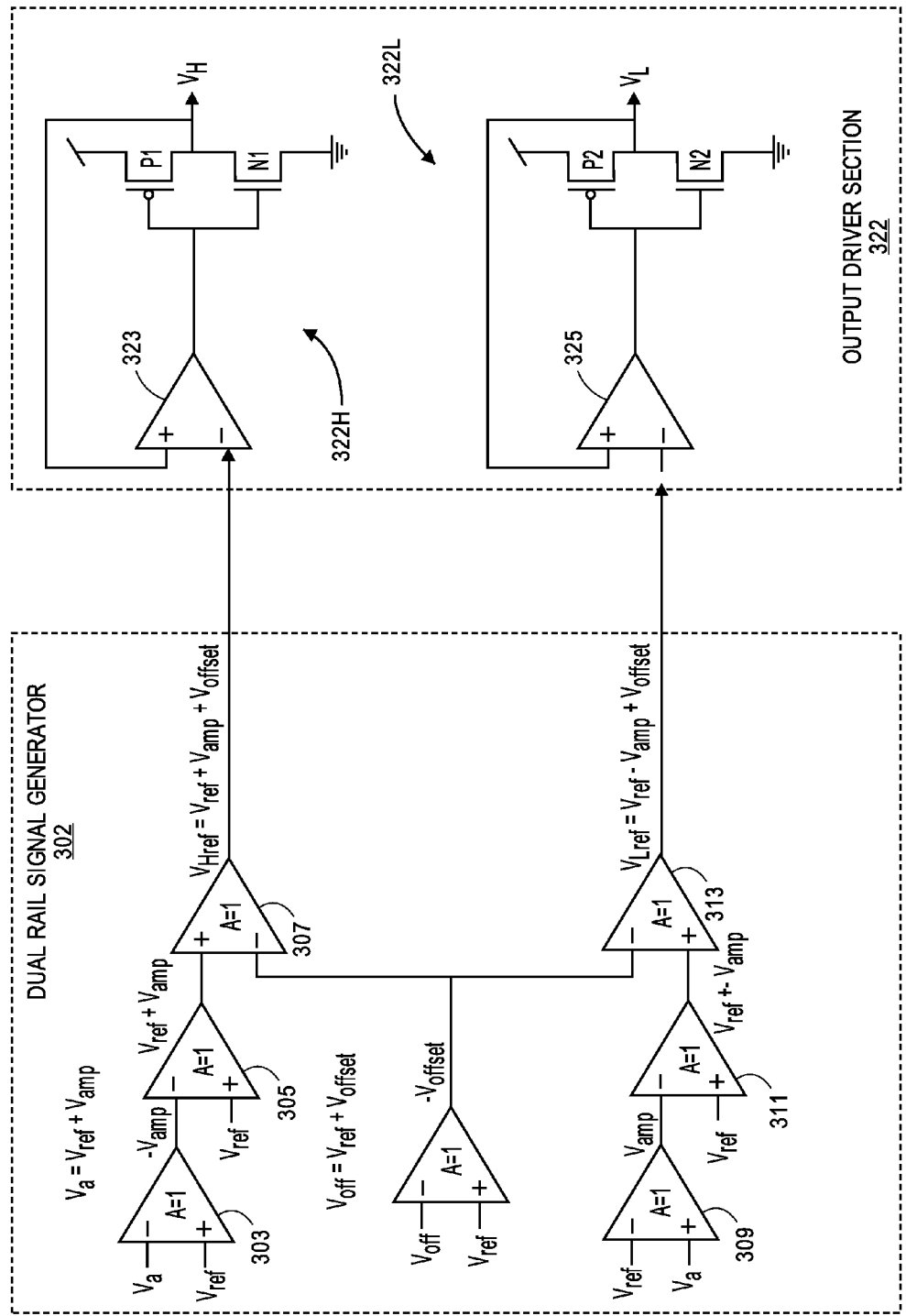
FIG. 3 is a schematic diagram of a dual rail generator in accordance with the signal flow diagram of FIG. 1 in accordance with some embodiments.

FIG. 3 is a schematic diagram of a circuit to implement the signal flow diagram of FIG. 2C and generate the High and Low reference signals, $V_H$ and $V_L$. However, instead of using the above described amplitude ($V_{amp}$) and offset ($V_{offset}$) signals, referenced versions, $V_a$ and $V_{off}$ (where $V_a=V_{ref}+V_{amp}$ and $V_{off}=V_{ref}+V_{offset}$) are used instead to more conveniently accommodate circuits (such as the circuit described below with reference to FIG. 4) that have an inherent reference component. Therefore, $V_a$ and $V_{off}$ are still amplitude and offset signals, as are those used for the diagram of FIG. 2C, except that they have an additional reference component built within.

The dual rail generator of FIG. 3 generally comprises a dual rail signal generator circuit 302 and an output driver section 322, coupled together as indicated. The dual rail signal generator 302 comprises adder circuits 303, 305, 307, 308, 309, 311, and 313, coupled together as shown to appropriately add/subtract $V_{ref}$, $V_a$, and $V_{off}$ in accordance with the above equations to generate High and Low reference rails, $V_{Href}$ and $V_{Lref}$. The reference rails, $V_{Href}$ and $V_{Lref}$, correspond to $V_H$ and $V_L$ above in value but may not be sufficiently amplified (buffered) for use as supplies to an actual load. Accordingly, they are amplified/regulated in the output driver section 322 by linear voltage regulators 322H and 322L, respectively, which provide a their outputs the regulated High and Low rails, $V_H$ and $V_L$.

In the depicted embodiment, each adder circuit in the dual rail reference generator section 302 has a voltage gain of A=1 and is implemented with a difference adder, which subtracts a first value from a second value. As shown in FIG. 3, they are appropriately configured to perform the above equations for VH ($V_{Href}$) and $V_L$ ($V_{Lref}$). It should be appreciated that they could be implemented with any suitable circuit for performing an addition or subtraction operations on two analog inputs, many of which are known to persons of ordinary skill (Below, however, with reference to FIG. 4, a novel approach using inverters is presented). For simplicity sake, the gain of each adder is one but this certainly is not required. The High and Low rail equations defined above could be implemented with adders having other gain values and depending on desired applications, variations on the above described equations may be desired (e.g., the addends could be weighted differently).

Each regulator (322H or 322L) is a unity gain linear regulator formed from an amplifier coupled to PMOS and NMOS transistors, all coupled together as shown. The High-side regulator 322H is formed from amplifier 323, PMOS transistor P1 and NMOS transistor N1. It receives at its input (negative input of amplifier 323) the High reference signal ($V_{Href}$), while its output is coupled to the gates of transistors P1 and N1. In turn, the transistor outputs (at their drains) are coupled back to the positive input of amplifier 323. The Low side regulator 322L is configured in the same way except that it is formed from amplifier 325, PMOS transistor P2 and NMOS transistor N2. (Note the term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed).

Because each amplifier is configured with negative feedback, the voltage at the input terminals is forced to equal one another. This results in the output voltages ($V_H$, $V_L$) tracking (or following) the input voltages ($V_{Href}$, $V_{Lref}$) and at the same time, being able to drive actual loads. Note that transistors N1 and P2 are represented with dashed lines. This is so because in some embodiments, the High side rail $V_H$ may be used to primarily source current to its load, while the Low side rail $V_L$ may primarily be used to sink current from its load. In such a case, N1 and P2 could be smaller than P1 and N2 or even omitted.

Figure 4:
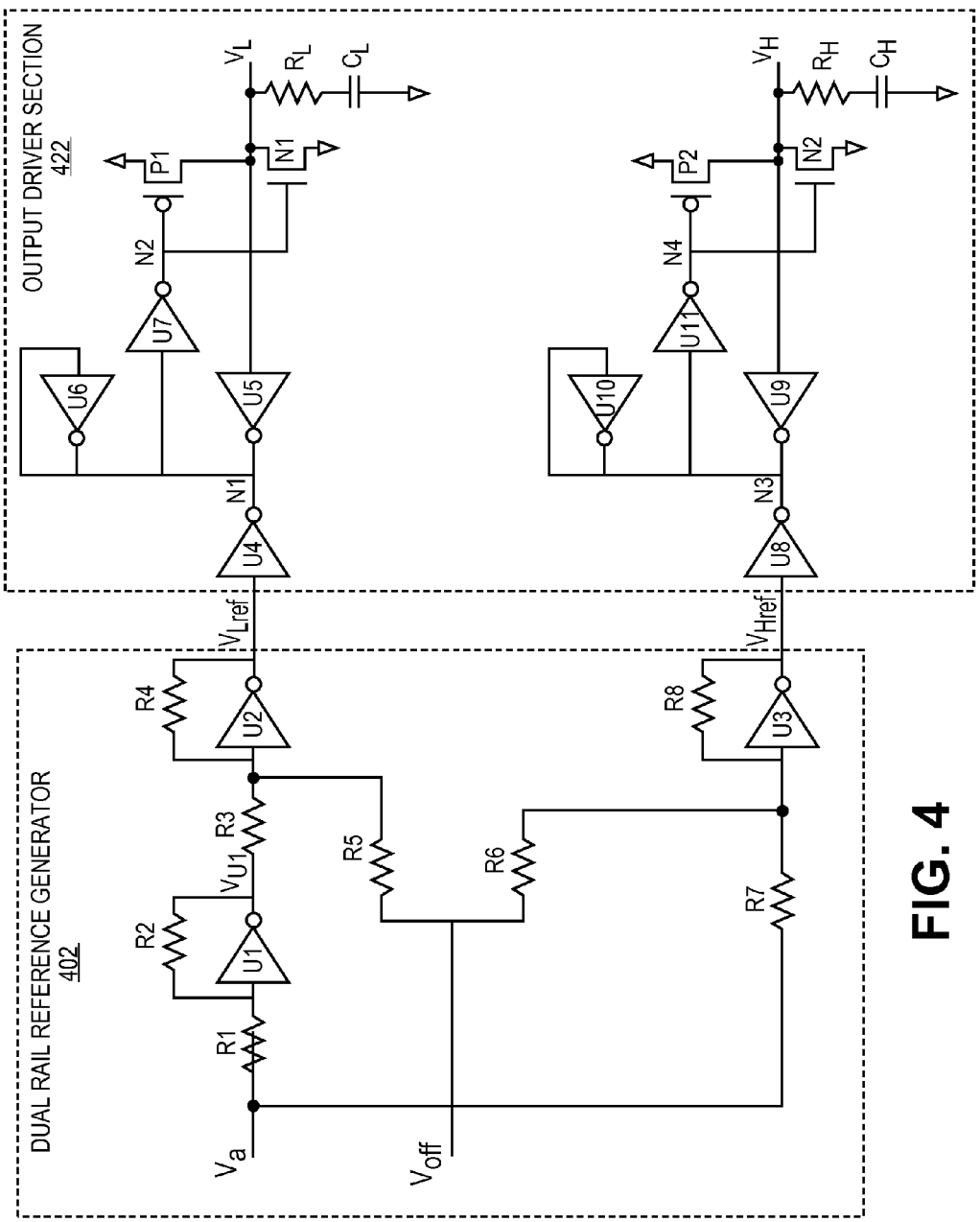
FIG. 4 is a schematic diagram of a dual rail generator in accordance with FIGS. 2 and 3 in accordance with some embodiments.

FIG. 4 shows a dual rail generator circuit, in accordance with some embodiments, that uses inverters for synthesis and regulation of the two output rails, $V_H$ and $V_L$, based on analog amplitude and offset voltage inputs, $V_a$ and $V_{off}$, respectively. $V_a$ and $V_{off}$ are referenced versions of $V_{amp}$ and $V_{offset}$ as defined above, based on an inherent reference voltage, $V_{ref}$, corresponding to the trip point of inverters used in the circuit.

The dual rail generator generally comprises a dual rail reference generator section 402 coupled to an output driver section 422. The reference generator portion 402 comprises Inverters U1, U2, U3 and resistors R1 to R8, while the output driver section 422 comprises inverters U4 to U11, transistors P1, P2, N1, N2, resistors RH and RL, and capacitors CH and CL, all coupled together as shown. In some embodiments, the inverters are formed from PMOS and NMOS transistors with their gates coupled together to provide an inverter input and their drains coupled together to provide an inverter output. In some embodiments, the inverters (except possibly U7 and U11) are designed to have the same trip points, and U1-U5, U8, and U9 are sized to have the same strengths. For example, the PMOS and NMOS transistors in U1-U6, and U8-U10 may be designed to have the same current carrying capability. The actual trip point value is not necessarily critical, so long as the values in the inverters are sufficiently close to one another, although it may be desirable to target the trip point at VCC/2 so that $V_H$ and $V_L$ may have a wider operating range. U6 and U10 may be designed to be weaker in strength. In contrast, U7 and U11 may be designed to be stronger, and their trip points need not necessarily be the same as the others.

The reference generator portion 402 will initially be discussed. Inverters U1 and U2, along with resistors R1-R4, make up a low-side section to generate a reference signal ($V_{Lref}$) for the low rail, while inverter U3 and resistors R7 and R8 make up the high-side section to generate the high rail reference ($V_{Href}$). With the depicted embodiment, the high and low side sections generate inverted versions, relative to inverter trip points, of the high and low side rails. The output driver section thus comprises driver circuits that invert the reference signal to provide the high and low rails.

Inverter U1 is configured to be an inverting amplifier having a gain of about −R2/R1 acting on the $V_{amp}$ component of $V_a$, relative to $V_{ref}$ (the trip point of the inverter). That is, an inverter, with feedback, acts similarly to an amplifier with negative feedback, except that it has an inherent offset corresponding to its trip point. Therefore, with resistors R1 and R2 configured as shown, the inverter's output voltage is equal to: $(-R2/R1)(Va-Vref)+V_{ref}$. When R1 and R2 are equal, this reduces to: $2V_{ref}-V_a$, or $V_{ref}-V_{amp}$. so, for example, if $V_{ref}$=0.6V and $V_a$=0.8V, then $V_{U1}$ would be 0.4V. (Note that this analysis assumes that the inverter gain is high, which may not be completely accurate, especially when inputs are close to the trip point. Accordingly, in some embodiments, the gain terms may be "tweaked" to achieve desired results, e.g., for a particular operating range).

Inverter amplifier circuits U2 and U3 are essentially the same. They are configured to function as summing inverter amplifiers (relative to the inverter trip points, i.e., the reference voltage). Summing inverter U2 sums the output from U1 ($V_{U1}$, which is $V_{ref}-V_{amp}$) with $V_{off}$($V_{offset}+V_{ref}$), while U3 sums $V_a$ with $V_{off}$. (Note that the high-side section doesn't have an inverter stage corresponding to U1 in the low-side path. This is so because in the high-side path, to generate $V_L$, the Vamp component in Va is added rather than subtracted).

The gain and relative weighting for the summed terms are determined by their associated resistors. With regard to U2, R4/R3 determines the gain for the $V_{U1}$ term, while R4/R5 determines the gain for the $V_{off}$ term. The output of U2 ($V_{Lref}$) will be: $V_{Lref}=-(R4/R3)(V_{U1}-V_{ref})-(R4/R5)(V_{off}-V_{ref})+V_{ref}$. Similarly, with regard to U3, R8/R7 determines the gain of the applied $V_a$ term, while R8/R6 determines the gain of the offset term $V_{off}$. The output, $V_{Href}$, is: $V_{Href}=-(R8/R7)(V_a-V_{ref})-(R8/R6)(V_{off}-V_{ref})+V_{ref}$. Thus, if R3, R4, and R5 are the same and if R6, R7, and R8 are the same, the output equations reduce to: $V_{Lref}=-(V_{U1}-V_{ref})-(V_{off}-V_{ref})+V_{ref}$ and $V_{Href}=-(V_a-V_{ref})-(V_{off}-V_{ref})+V_{ref}$. The outputs, $V_{Lref}$ and $V_{Href}$, result in inverted, relative to the inverter trip points, versions of the high and low rails. The amplifiers (or drivers) in the output driver section 422 correct this in providing the high and low rails.

As an example to illustrate how the dual rail reference generator 402 works, assume that R1=R2 (e.g., 10K Ohms), R3=R4=R5 (e.g., 10K Ohms) and R6=R7=R8 (e.g., 10K Ohms). Also assume, as with the above example, that $V_{ref}$=0.6V, the offset is to be 0.1V (the applied $V_{off}$ would thus be 0.7V), and $V_{amp}$ is to be 0.2V (the applied $V_a$ would thus be 0.8V and $V_{U1}$ would be 0.4V). With these values, the high and low rails should be 0.9V and 0.7V, respectively. Applying these values to the equations for U2 and U7, the Low reference voltage, $V_{Lref}$, would be 0.7 while the high reference voltage, $V_{Href}$, would be 0.3V. This is correct because after being inverted by the output driver sections (relative to the 0.6V reference), they become 0.5V and 0.9V respectively, which are the correct values.

(Again, it should be appreciated that the actual resistor values, amplifier gains, and weights are not necessarily important, so long as the overall transfer functions for $V_H/(V_a, V_{off})$ and $V_L/(V_a, V_{off})$ provide for sufficiently consistent, predictable results for acceptable input and output operating ranges. This also applies to the circuits in the output driver section 422, discussed in the following section).

The output driver section 422 comprises inverters U4 to U11, MOS transistors N1, N2, P1, P2, and load resistors and capacitors $R_H$, $R_L$, $C_H$, and $C_L$. The low side driver is formed from inverters U4 to U7, transistors P1, P2, resistor RL, and capacitor CL; while the high side driver comprises inverters U7 to U10, transistors P2, N2, resistor RH, and capacitor CH.

With the low side driver, inverters U4 and U5 are coupled together at their inverter outputs at node N1 in a mirrored configuration. With this configuration, they act like an inverting analog amplifier to provide at an input ($V_{Lref}$, $V_L$) the analog inverse of the other input, relative to $V_{ref}$ (inverter trip points, which are to be the same). Therefore, the voltage at $V_L$ will be: $V_L=2V_{ref}-V_{Lref}$. (Note that as used in this circuit, the inverter inputs (at $V_{Lref}$ and $V_L$) function both as inputs and outputs. It may be helpful to think of them as ends of a see-saw, with a fulcrum in the middle pushing up to the reference voltage level. As one side goes up, the other goes down and when perfectly balanced, the inputs and node N1 approach $V_{ref}$. On the other hand, when $V_{Lref}$ goes up or down, i.e., in response to changes in $V_a$ and/or $V_{off}$, it forces the voltage ($V_L$) at the other end of the "see-saw" to go down or up in the opposite direction accordingly.

Inverter U6 is a relatively weak inverter, designed to have its trip point at $V_{ref}$. With its input shorted to its output, it generates at its output the reference signal, $V_{ref}$, and is coupled to the inverter outputs of mirrored inverters U4, U5 (node N1) to provide them with a relatively weak load. It serves to reduce their gain, acting like ballast to stabilize their analog performance.

Inverter U7 is relatively large (e.g., twice the current carrying capability as inverters U1, U2, U3, U4, or U5) and has it trip point relatively close to those of the others, but this is not critical. It functions to drive push/pull output transistors P1, N1 to appropriately regulate $V_L$. Thus, U4/U5, U6, and P1/N1 form the negative feedback loop to regulate $V_L$. As $V_L$ goes up (e.g., due to changes in the output load), it causes N1 to go lower, which causes N2 to go up thereby turning down P1 and turning up N1 to bring $V_L$ back down. It works the same way, but in the opposite direction, when $V_L$ goes down. Resistor RL and capacitor CL are coupled in series between $V_L$ and VSS to provide stability at the output, $V_L$.

The high side driver is configured and operates essentially the same as the low side driver, so it will not be described to the same extent. However, it's worth pointing out that in some embodiments, with the high side driver, because the high rail, $V_H$, may serve primarily as a current source, the pull-up FET, P2, may be sized larger than the pull-down transistor N2 and in some cases, N2 may be omitted altogether. Conversely, with the low side driver, the pull-down transistor N1 may be sized larger than P1 when the low rail, $V_L$, serves primarily as a current sink. In some embodiments, P1 may be omitted altogether.

PWM with Fixed Reference Comparator

Figure 5:
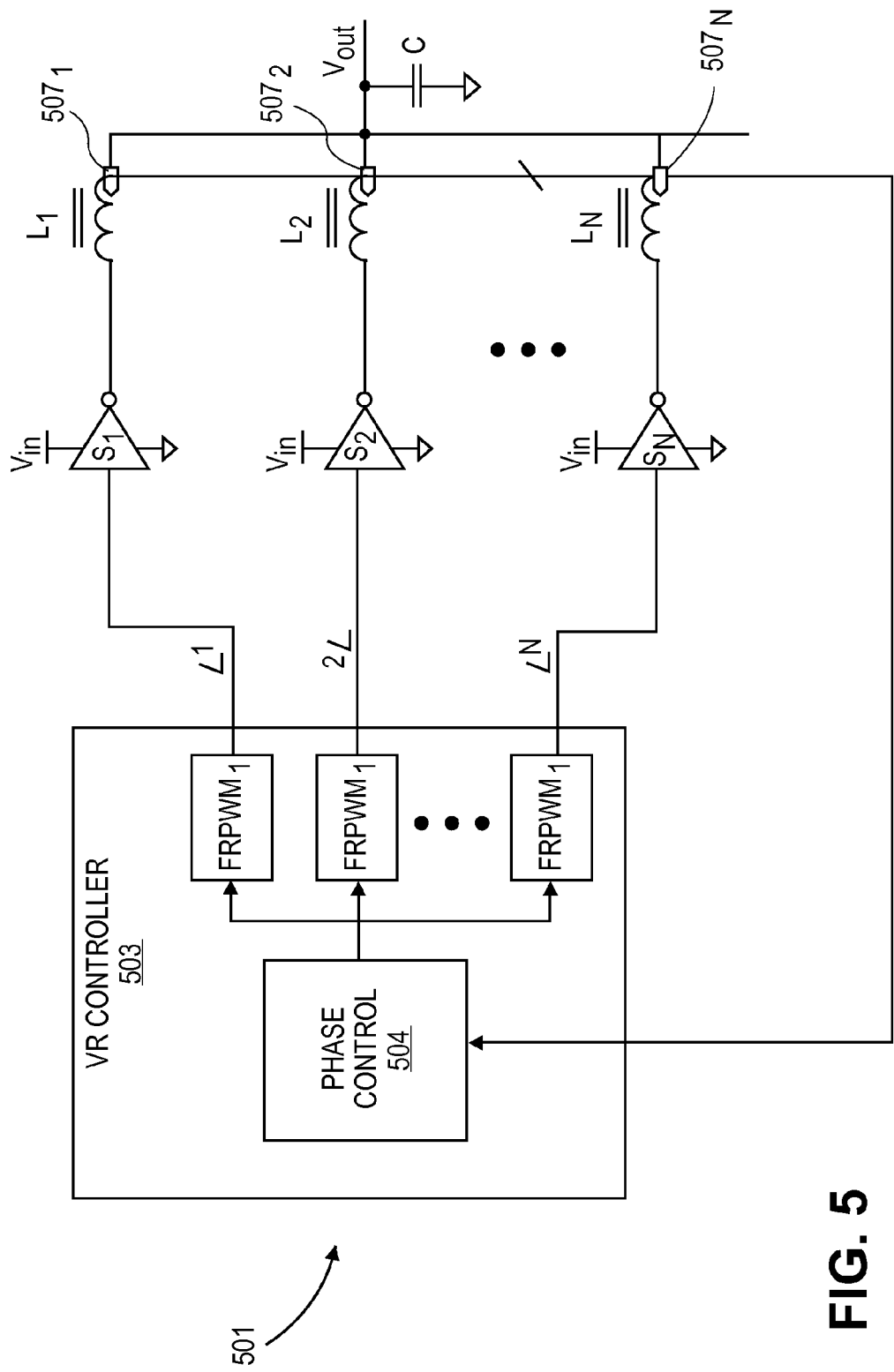
FIG. 5 is a schematic diagram of a switching voltage regulator with a fixed reference comparator in accordance with some embodiments.

FIG. 5 shows an N-phase, switching type voltage regulator 501. It generally comprises a VR controller 503 coupled to N switch drivers (or switches) $S_1$ to $S_N$, one for each phase. In turn, the switches are coupled to N corresponding output sections formed from inductors $L_1$ to $L_N$, which are coupled to a common, regulated output voltage node $V_{out}$ at capacitor C. Feedback sensors $507_1$ to $507_N$ are coupled to the output (e.g., at the inductor) to provide output feedback information back to the controller 503 for closed loop control of the output voltage $V_{out}$. (It should be appreciated that the depicted switching regulator is presented in a simplified form, for illustrative purposes, to put into context the fixed reference type PWMs of this disclosure. Accordingly, the switches, output sections, feedback sensors and other elements known in the art are not limited to any specific implementation but rather are intended to cover any devices suitable to perform their functions. Similarly, the depicted elements could be implemented in a single chip, a chip and external circuit board, or in multiple chips and/or multiple chips in combination with one or more circuit boards. For example, in some embodiments, the VR controller could be in a chip, while the switch drivers and/or output sections could be implemented with external discrete components on a circuit board. On the other hand, they could all be implemented in a single module).

The VR controller comprises a phase control section 504 coupled to fixed reference PWM (FRPWM) circuits ($PWM_1$ to $PWM_N$). It controls these PWMs to generate bit stream drive signals for their respective switches. For each PWM, it controls their duty cycle, in response to feedback from their associated sensor 507, to regulate the output voltage at a consistent level. It may also control their phase relationships, relative to each other and perform other tasks. Each PWM comprises a fixed reference comparator to generate its bit stream. Such PWMs will be discussed in more detail in the following sections.

Figure 6:
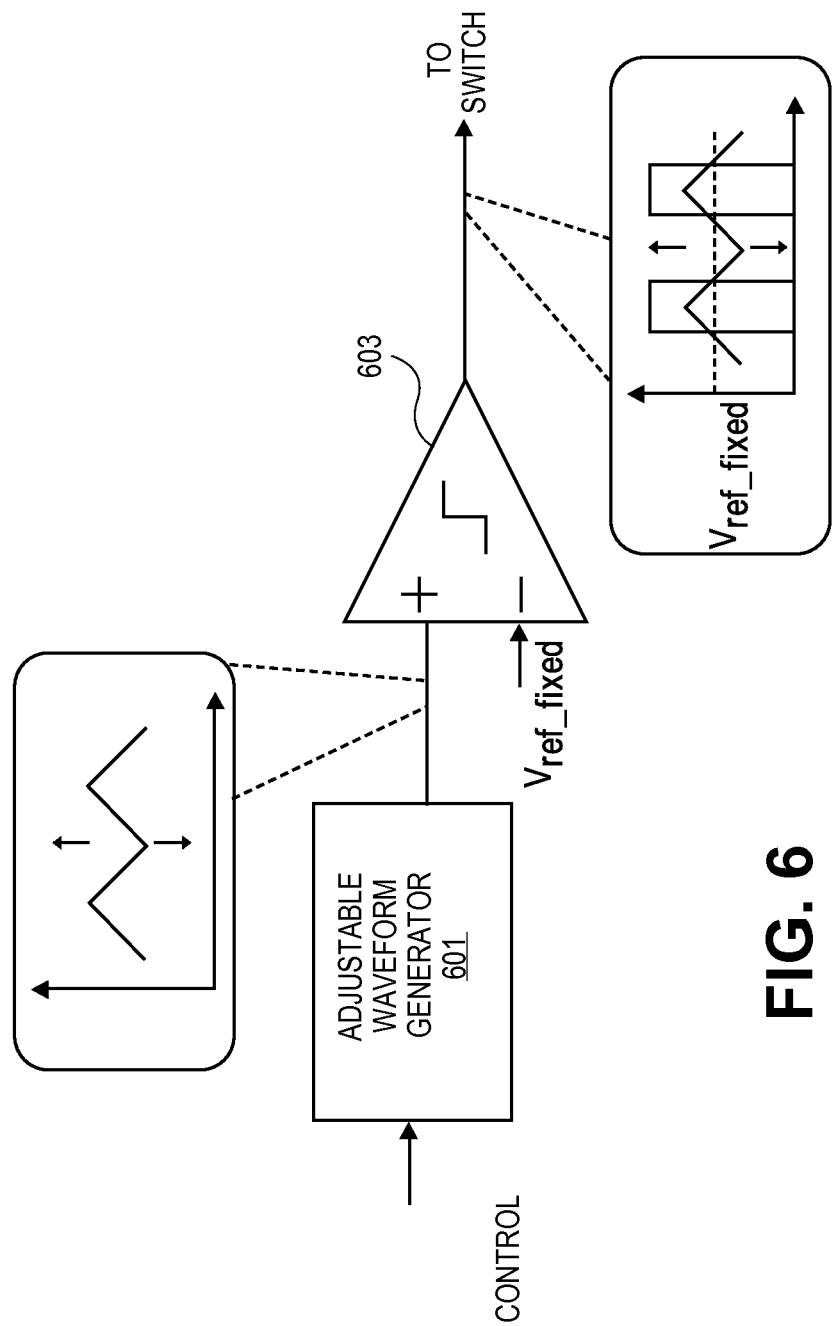
FIG. 6 is a block diagram of a portion of a pulse width modulator with a fixed reference comparator in accordance with some embodiments.

FIG. 6 shows a portion of a PWM with a fixed reference comparator in accordance with some embodiments. it generally comprises a variable waveform generator 601 coupled to a fixed reference comparator 603 to generate at its output a bit stream with a controllably variable duty cycle. (As used herein, the term, "fixed reference comparator" refers to a circuit to compare an input against a substantially fixed reference signal. The fixed reference signal may be supplied to the comparator circuit, or it could be defined by or within the comparator itself. Moreover, the fixed reference may actually be adjustable, e.g., for a trimming, calibration or adjustment setting. The fact that it is referred to as "fixed" is meant to indicate that it is not adjusted during operation to adjust the duty cycle of the bit stream generated by the comparator). The waveform generator generates a periodic waveform, cycling between low and high values. It may generate any suitable waveform including but not limited to a sinusoidal waveform, a triangular waveform, and a saw-tooth waveform, although a linearly changing waveform may be desired to provide for a linearly adjustable duty cycle. The waveform generator has a control input to control the amplitude and/or offset of the waveform. The waveform generator output is coupled to the positive input of the fixed reference comparator 603 while a fixed reference voltage $V_{ref\_fixed}$ is coupled to its negative input. When the waveform is below the reference voltage, the comparator outputs a Low, and when it is above the reference voltage, the comparator outputs a High. Thus, a bit stream is generated with a frequency corresponding to the frequency of the waveform. Its duty cycle depends on the offset position of the waveform relative to the reference voltage. By appropriately controlling the control input to the waveform generator, the waveform can be shifted upward or downward, relative to the reference voltage, to either increase or decrease the amount of time per cycle that the waveform is below (or above) the fixed reference voltage. In this way, the bit stream duty cycle can be adjusted accordingly, corresponding to the percentage of time during each cycle that it is above the reference level. (Alternatively, the variable waveform's amplitude could be adjusted to adjust the bit stream duty cycle).

Figure 7:
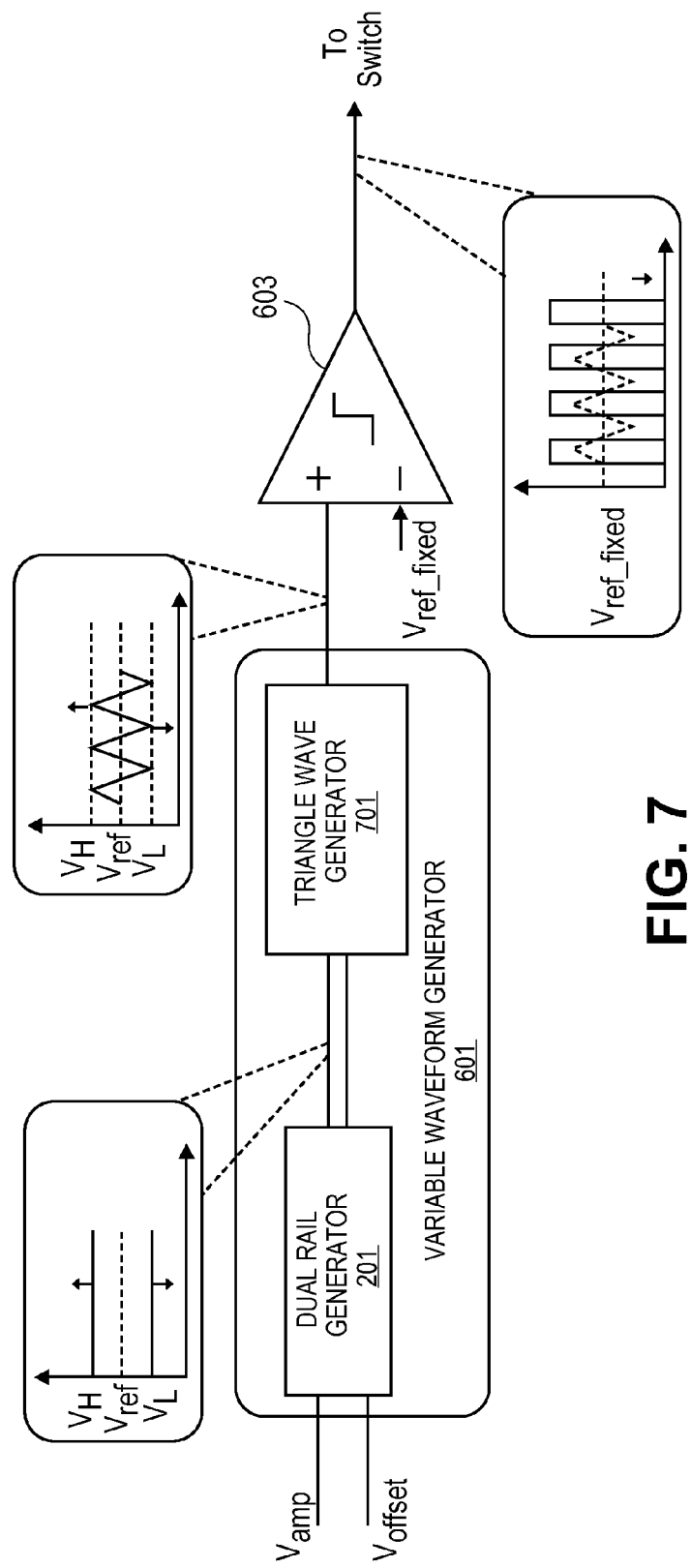
FIG. 7 is a block diagram of a portion of a pulse width modulator with a fixed reference comparator using a dual rail generator in accordance with some embodiments.

FIG. 7 shows a portion of a fixed comparator PWM using a dual rail generator. The dual rail generator 201 provides adjustable high and low rails, $V_H$ and $V_L$, to the triangular waveform generator, which works in cooperation with the dual rail generator to generate a triangular waveform cycling between the low and high rails. In some embodiments, the fixed reference ($V_{ref\_fixed}$) corresponds to the reference voltage ($V_{ref}$) used in the dual rail generator 201. The positions of the high and low rails, which are controlled by the amplitude and offset controls, determines the height and offset of the triangle wave signal relative to the reference voltage. Therefore, they can be used to control the duty cycle of the output bit stream. In some embodiments, the amplitude may initially be set (e.g., at start-up or via periodic calibration), and the offset control can then be used by the PWM controller to control the duty cycle of the bit stream. (For information on a waveform generator working in cooperation with a dual rail generator to generate a variable waveform, reference is made to co-pending, commonly owned U.S. patent application Ser. No. 11/641,006 titled, SIGNAL GENERATING CIRCUIT, filed on Dec. 19, 2006, which is incorporated by reference into the present application).

Figure 8:
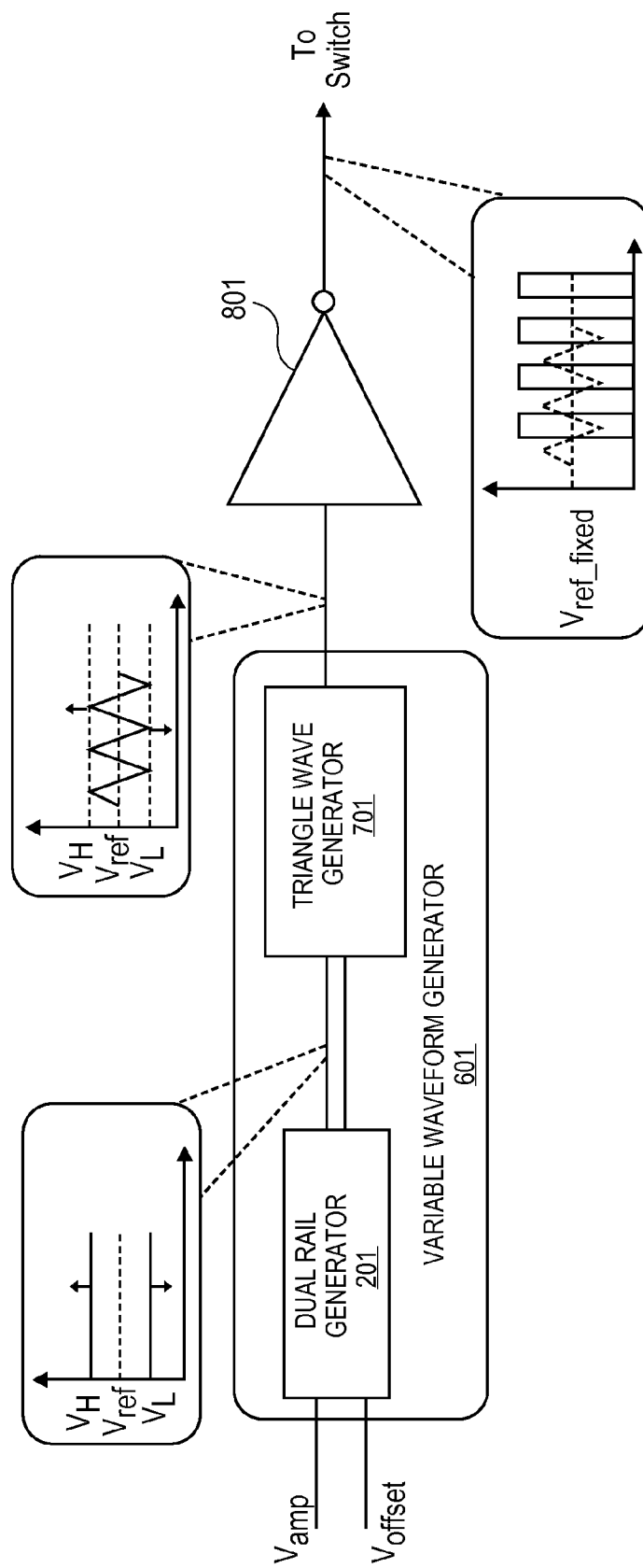
FIG. 8 is a block diagram of a portion of a pulse width modulator with a fixed reference comparator formed from an inverter in accordance with some embodiments.

FIG. 8 shows the PWM portion of FIG. 7 with an inverter used as the fixed reference comparator. In some embodiments, it's designed to have a trip-point that corresponds to the reference voltage ($V_{ref}$) of the dual rail generator 201. In some embodiments where a dual rail generator such as is shown in FIG. 4 is used, the trip-point may be designed to correspond to the trip points of inverters in the dual rail generator used to set the reference voltage ($V_{ref}$).

Figure 9:
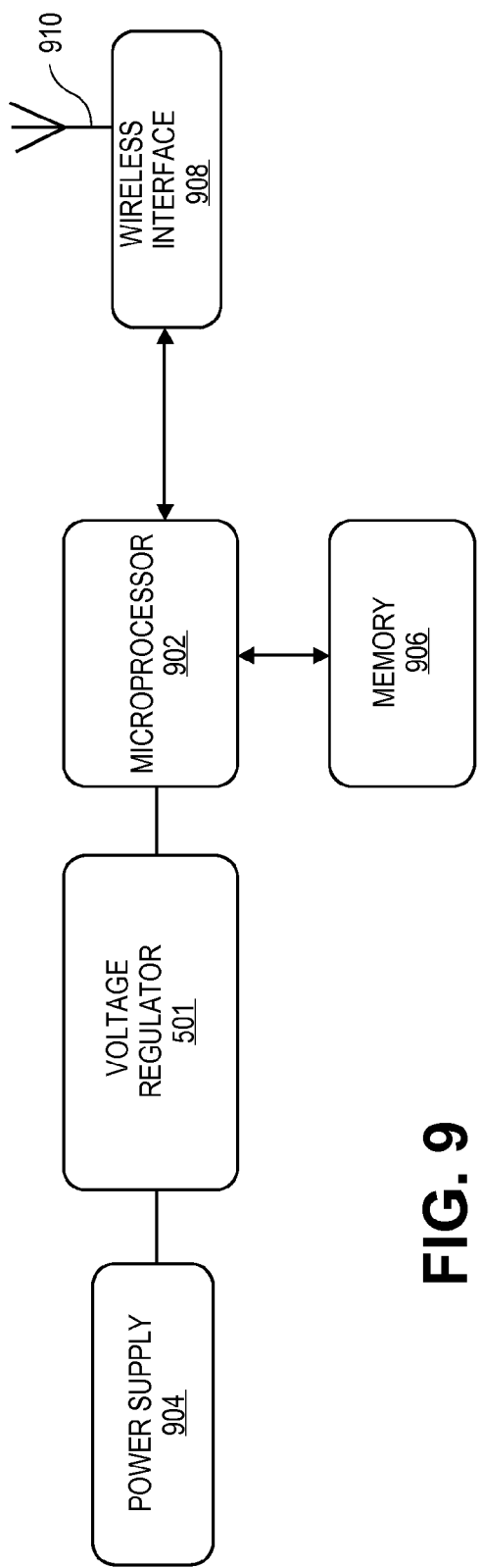
FIG. 9 is a block diagram of a computer system having a voltage regulator with a PWM in accordance with some embodiments.

With reference to FIG. 9, one example of a computer system is shown. The depicted system generally comprises a processor 902 that is coupled to a voltage regulator 501 (as described with reference to FIG. 5), a wireless interface 908, and to memory 906. It is coupled to the voltage regulator 501, which in turn is coupled to a power supply 904, to receive from the voltage regulator at least one regulated voltage supply, derived from power supply 904. The wireless interface 908 is coupled to an antenna 910 to communicatively link the processor through the wireless interface 908 to a wireless network (not shown).

It should be noted that the depicted system could be implemented in different forms. That is, it could be implemented on a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit comprising:
    a comparator to receive a reference signal; and
    an adjustable waveform generator, coupled to the comparator, to adjust an offset of a periodic waveform relative to a level of a non-ground signal, the non-ground signal being different from the reference signal, the comparator to generate a bit stream having a controllably adjustable duty cycle corresponding to the adjustment of the periodic waveform, wherein the non-ground signal is one of a dual voltage rail, and wherein the adjustable waveform generator includes:
        a control unit to adjust the offset of the dual voltage rail to adjust the offset of the periodic waveform.

2. The circuit of claim 1, wherein the adjustable waveform generator is operable to adjust amplitude and the offset of the periodic waveform.

3. The circuit of claim 1, wherein the comparator comprises:
    a first input to receive the reference signal which is a fixed voltage reference signal; and
    a second input to receive the periodic waveform.

4. The circuit of claim 1, wherein the adjustable waveform generator to generate the periodic waveform which comprises at least one of:
    triangle wave;
    sinusoidal wave; or
    saw-tooth wave.

5. The circuit of claim 1, wherein the adjustable waveform generator comprises:
    a dual rail generator coupled to a triangle waveform generator, the dual voltage generator to generate the dual voltage rail.

6. The circuit of claim 5, wherein the dual rail generator is operable to generate adjustable high and low voltage supplies according to applied amplitude and offset signals.

7. The circuit of claim 5, wherein the dual rail generator comprises:
    a dual rail reference generator to generate high and low reference signals; and
    an output driver comprising a high side driver coupled to the high reference signal to drive the high voltage supply.

8. The circuit of claim 7, wherein the output driver further comprises:
    a low side driver coupled to the low reference signal to drive the low voltage supply.

9. The circuit of claim 8, wherein the low side driver comprises a pull-down transistor to sink current through the low voltage supply.

10. The circuit of claim 7, wherein the high side driver comprises:
    minor-coupled inverters coupled between the high side reference signal and the high voltage supply as part of a loop to regulate the high voltage supply.

11. The circuit of claim 7, wherein the high side driver comprises:
    a pull-up transistor at its output to source current through the high voltage supply.

12. The circuit of claim 5, wherein the dual rail reference generator comprises:
    an analog amplifier including an inverter circuit having a resistor coupled between its output and input.

13. The circuit of claim 1, wherein the comparator comprises an inverter, and wherein the level of the reference signal corresponds to a trip point of the inverter.

14. A computer system comprising:
    a processor; and
    a voltage regulator coupled to the processor to provide it with a regulated voltage supply, the voltage regulator comprising a pulse width modulator comprising:
        a comparator to receive a reference signal; and
        an adjustable waveform generator, coupled to the comparator, to adjust an offset of a periodic waveform relative to a level of a non-ground signal, the non-ground signal being different from the reference signal, the comparator to generate a bit stream having a controllably adjustable duty cycle corresponding to the adjustment of the periodic waveform, wherein the non-ground signal is one of a dual voltage rail, and wherein the adjustable waveform generator includes:
            a control unit to adjust the offset of the dual voltage rail to adjust the offset of the periodic waveform.

15. The computer system of claim 14 further comprises:
    a power supply coupled to the voltage regulator to provide it with power to generate the regulated voltage supply.

16. The computer system of claim 15, wherein the power supply comprises a re-chargeable battery.

17. The computer system of claim 14, wherein the voltage regulator and the processor are in an integrated circuit.

18. The computer system of claim 14, wherein the adjustable waveform generator is operable to adjust amplitude and the offset of the periodic waveform.

19. The computer system of claim 14, wherein the comparator comprises:
    a first input to receive the level of the reference voltage which is a fixed voltage reference signal; and
    a second input to receive the periodic waveform.

20. The computer system of claim 14, wherein the adjustable waveform generator comprises:
    a dual rail generator coupled to a triangle waveform generator, the dual rail generator to generate the dual voltage rail.

21. A voltage regulator comprising:
    means for adjusting an offset of a periodic waveform relative to a level of a non-ground signal; and
    means for comparing the periodic waveform with a level of the reference signal to generate a bit stream having a controllably adjustable duty cycle corresponding to the adjustment of the periodic waveform, wherein the non-ground signal is different from the reference signal, wherein the non-ground signal is one of a dual voltage rail, and wherein the means for adjusting the offset includes:
    a control unit to adjust the offset of the dual voltage rail to adjust the offset of the periodic waveform.

22. The voltage regulator of claim 21, wherein the means for adjusting is operable to adjust amplitude and the offset of the periodic waveform.

* * * * *